United States Patent
Petersson et al.

(10) Patent No.: US 7,952,354 B2
(45) Date of Patent: May 31, 2011

(54) SYSTEM AND METHOD FOR FAST MR IMAGING OF METABOLITES AT SELECTIVE EXCITATION FREQUENCIES

(75) Inventors: Stefan Petersson, Helsingborg (SE); Sven Mansson, Bjarred (SE)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/719,081

(22) Filed: Mar. 8, 2010

(65) Prior Publication Data

US 2010/0156417 A1    Jun. 24, 2010

Related U.S. Application Data

(62) Division of application No. 11/562,391, filed on Nov. 21, 2006, now Pat. No. 7,719,269.

(51) Int. Cl.
*G01V 3/00* (2006.01)

(52) U.S. Cl. ........... 324/307; 324/309

(58) Field of Classification Search ........... 324/307, 324/309
See application file for complete search history.

(56) References Cited

U.S. PATENT DOCUMENTS

| | | | |
|---|---|---|---|
| 5,578,921 A * | 11/1996 | Morrell | 324/307 |
| 5,677,628 A | 10/1997 | Watanabe et al. | |
| 6,275,040 B1 * | 8/2001 | Zur | 324/320 |
| 6,304,084 B1 | 10/2001 | Star-Lack et al. | |
| 6,583,623 B1 * | 6/2003 | Kwok et al. | 324/307 |
| 6,806,706 B2 | 10/2004 | Gurr | |
| 7,034,530 B2 | 4/2006 | Ahluwalia et al. | |
| 7,042,214 B2 | 5/2006 | Cunningham et al. | |
| 7,772,844 B2 * | 8/2010 | Hurd | 324/309 |
| 2004/0171928 A1 | 9/2004 | Petersson et al. | |

* cited by examiner

*Primary Examiner* — Louis M Arana
(74) *Attorney, Agent, or Firm* — Ziolkowski Patent Solutions Group, SC (57) ABSTRACT

A system and method are provided for imaging multiple substances, such as contrast agents and metabolites in vivo, with selective excitation frequencies. A first substance is excited with a frequency selective pulse, then a second substance is excited with another frequency selective pulse. The signals resulting from these pulses are acquired in an order reversed from the order in which the pulses were applied. In some embodiments, more than two substances may be imaged. The system and method thus provide for quick and efficient utilization of the magnetization of multiple substances for spectral-spatial imaging.

17 Claims, 6 Drawing Sheets

SYSTEM AND METHOD FOR FAST MR IMAGING OF METABOLITES AT SELECTIVE EXCITATION FREQUENCIES

CROSS-REFERENCE TO RELATED APPLICATION

The present application is a divisional of and claims priority to U.S. Ser. No. 11/562,391, filed Nov. 21, 2006, the disclosure of which is incorporated herein by reference.

BACKGROUND OF THE INVENTION

The present invention relates generally to a system and method for magnetic resonance (MR) imaging, and more particularly, to an MR system and pulse sequence which slice-selectively excites multiple frequencies for quick and efficient imaging. Spectral-spatial radio frequency (RF) pulses may be used to create magnetization in specific frequency profiles without significantly affecting neighboring slices or nearby frequency ranges. The signals resulting from such pulses are then read in an order reversed from the order in which the pulses were applied.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which has a frequency near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The set of received nuclear magnetic resonance (NMR) signals resulting from a scan sequence are digitized and sent to a data processing unit for image reconstruction using one of many well known reconstruction techniques. It is desirable that the imaging process, from data acquisition to reconstruction, be performed as quickly as possible for improved patient comfort and throughput.

For some procedures and investigations, it is also desirable for MR images to display spectral information in addition to spatial information. The traditional method for creating such images is known as "chemical shift imaging" (CSI). CSI has been employed to monitor metabolic and other internal processes of patients, including imaging hyperpolarized substances such as 13-C labeled contrast agents and metabolites thereof. The hyperpolarization of contrast agents tends to have a very limited lifetime; typical T1 lifetimes are on the order of a few minutes in vivo.

However, CSI, as a sequence for imaging hyperpolarized substances, has some drawbacks which limit available signal-to-noise ratio and thus image quality. For example, CSI tends to acquire data slowly, considering the short lifetimes of the increased magnetization of hyperpolarized substances. In addition, CSI typically uses a large number of RF excitations. Each excitation irretrievably destroys the magnetization of hyperpolarized substances. Additionally, MR procedures which require very fast or periodic data acquisition (such as cardiac imaging, or metabolic imaging of the heart) are difficult to perform with CSI sequences. CSI typically takes about 15 seconds to complete, whereas cardiac and related metabolic imaging should be completed within a few heartbeats or a few seconds.

Non-CSI techniques for imaging hyperpolarized substances without acquiring spectral information include single-shot techniques (e.g. a strong RF pulse which destroys all magnetization and attempts to acquire all data for multiple metabolites at once) or imaging with a large number of small flip-angle RF pulses (e.g. multiple excitations with flip angles on the order of 1 or 2 degrees). These approaches excite all frequency ranges for metabolites of interest simultaneously, destroying hyperpolarization of all metabolites with each pulse. In addition, when pulses of lower flip angle are used, a lower signal-to-noise ratio (SNR), and hence a lower image resolution, is the result.

It would therefore be desirable to have a system and method which overcomes the aforementioned drawbacks of MR imaging with spectral information and hyperpolarization. Specifically, it would be desirable to excite and image hyperpolarized agents and metabolites thereof within a short time, while efficiently utilizing the full magnetization of each substance and acquiring spectral information.

BRIEF DESCRIPTION OF THE INVENTION

A system and method for slice-selectively exciting resonant frequencies for substances of interest are provided. Such substances may include contrast agents and metabolites, such as 13-C contrast agents. In this regard, a number of spectral-spatial RF pulses may be emitted to excite frequencies in a subject of interest. The signals resulting from these pulses are read in an order reversed from the order in which the pulses were applied in one or more of several well-known read-out sequences.

In accordance with one aspect of the present invention, an MR system includes a plurality of gradient coils, an RF coil assembly, and a system control. The system control is programmed to cause the RF coil assembly to emit two spectral-spatial RF pulses, then detect the resulting MR signals from the second pulse before detecting the MR signals from the first pulse.

In accordance with another aspect of the invention, a method for MR imaging is disclosed. The method includes individually exiting the resonant frequencies of two or more metabolites at one flip angle, then simultaneously exciting the resonant frequencies of the metabolites at a second flip angle. After excitation, the resulting MR signals of the metabolites are detected.

According to a further embodiment, a sequence of instructions is stored on a computer readable storage medium. When the instructions are executed by a computer, the computer is caused to request transmission of a spectral-spatial pulse at one frequency, transmission of a dephasing gradient pulse for that frequency, transmission of another spectral-spatial pulse at another frequency, and then transmission of an RF pulse over a frequency range including both frequencies.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

Figure 1:
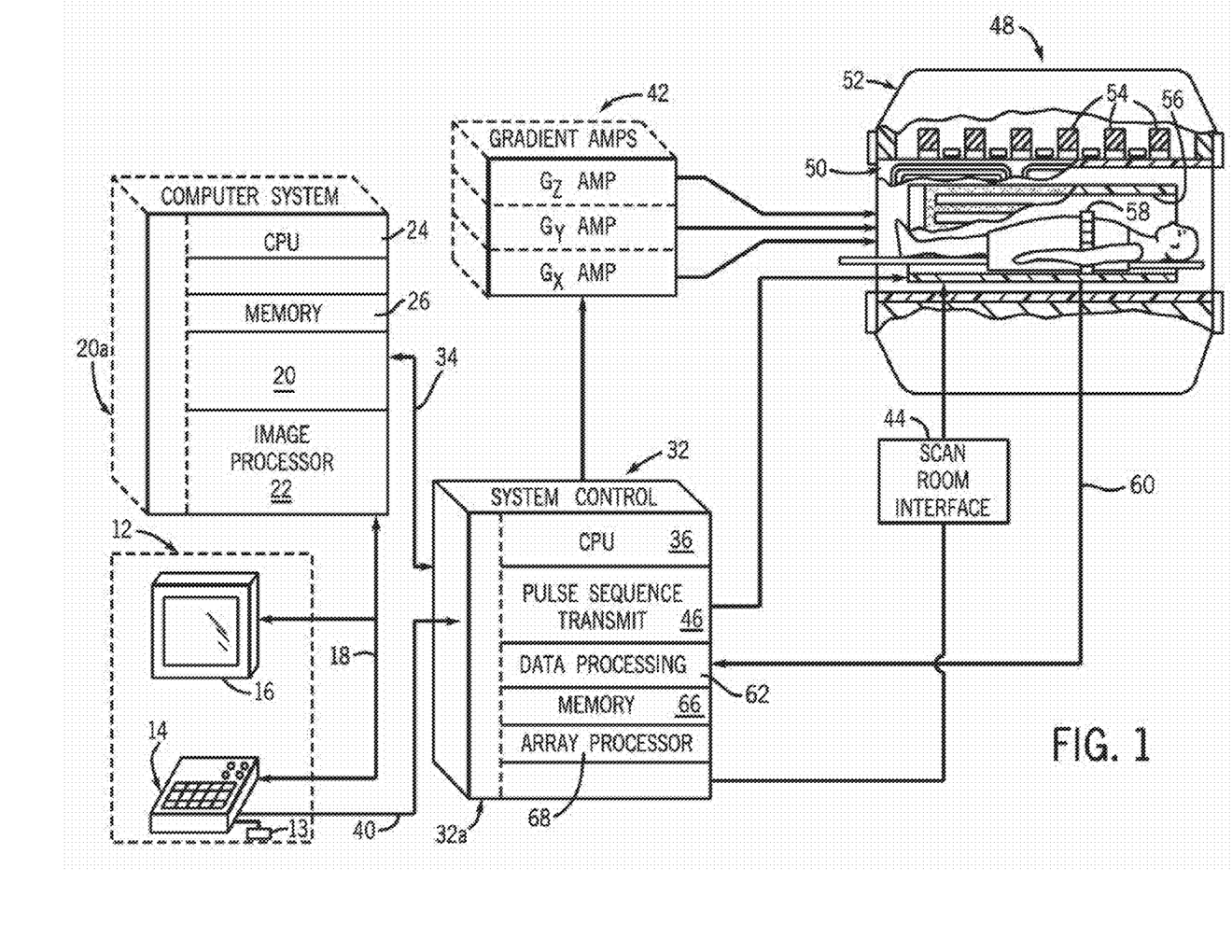
FIG. 1 is a schematic block diagram of an exemplary MR imaging system incorporating an embodiment of the present invention.

Referring to FIG. 1, the major components of an example magnetic resonance imaging (MRI) system 10 incorporating an embodiment of the present invention are shown. The operation of the system may be controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, which may include a frame buffer for storing image data arrays. The computer system 20 may also be connected to permanent or back-up memory storage, a network, or may communicate with a separate system control 32 through a high speed serial link 34. The input device 13 can include a mouse, keyboard, track ball, touch activated screen, light wand, or any similar or equivalent input device, and may be used for interactive geometry prescription.

The system control 32 includes a set of modules connected together by a backplane 32a and connected to the operator console 12 through a serial link 40. It is through link 40 that the system control 32 receives commands from the operator to indicate the scan sequence that is to be performed. The pulse sequence transmit module 38 commands the scanner components to carry out the desired scan sequence, by sending instructions, commands, and/or requests describing the timing, strength and shape of the RF pulses and pulse sequences to be produced, to correspond to the timing and length of the data acquisition window. The system control 32 also connects to a set of gradient amplifiers 42, to indicate the timing and shape of the gradient pulses that are produced during the scan. The system control 32 may also receive patient data from a scan room interface 44, which may relate data from a user or from a number of different sensors connected to the patient, such as ECG signals from electrodes attached to the patient.

The gradient waveform instructions produced by system control 32 are sent to the gradient amplifier system 42 having Gx, Gy, and Gz amplifiers. Amplifiers 42 may be external of scanner 48, or may be integrated therein. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and an RF coil assembly 56, 58. RF coil assembly may include a whole-body RF transmit coil 56, surface or parallel imaging coils 58, or both. The coils 56, 58 of the RF coil assembly may be configured for both transmitting and receiving, or for transmit-only or receive-only. A pulse generator (not shown) integrated into the scanner equipment 48 produces RF pulses in accordance with the instructions of the pulse sequence transmit module 46 which are amplified and coupled to the RF coil 56 for transmission. Alternatively, RF transmit coil 56 may be replaced or augmented with surface and/or parallel transmit coils, such as coil 58. Similarly, the resulting signals emitted by the excited nuclei in the patient may be sensed by separate receive coils, such as parallel coils or surface coils 58, and are then sent over a data link 60. The MR signals are demodulated, filtered, and digitized in the data processing section 62 of the system control 32.

A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory 26. In response to commands received from the operator console 12, this image data may be archived in long term storage or may be further processed by the image processor 22 and conveyed to the operator console 12 and presented on the display 16.

Figure 2:
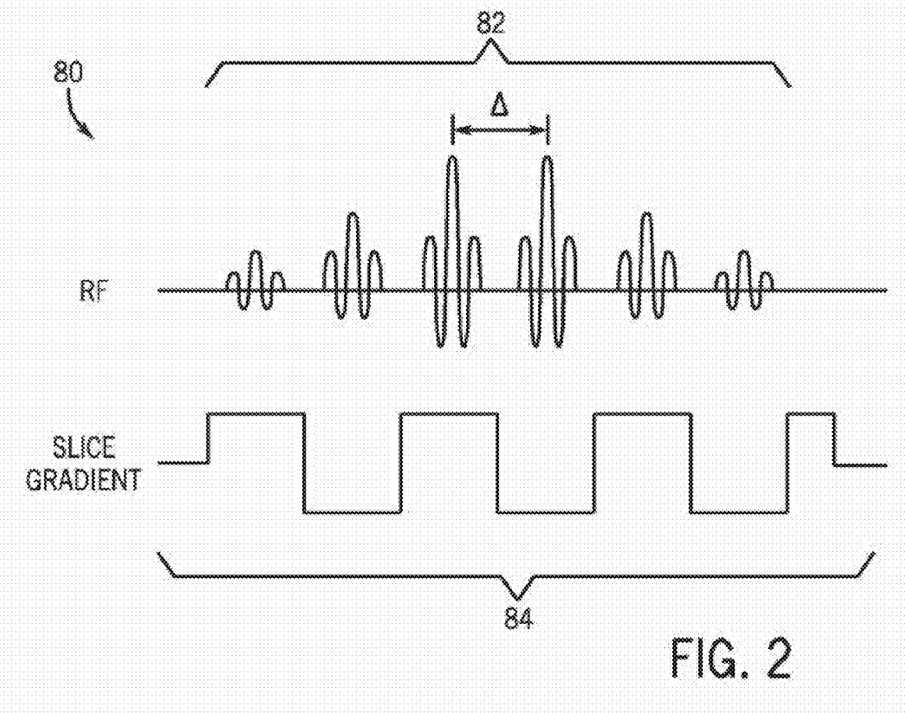
FIG. 2 is a graph of an exemplary RF pulse train and slice gradient waveform of a spectral-spatial pulse in accordance with an embodiment of the present invention.

Referring now to FIG. 2, an exemplary spectral-spatial type excitation pulse 80 is depicted. As discussed above, spectral-spatial imaging is a type of imaging in which spectral data regarding the type of substance being imaged is combined with the typical slice selection of common MR imaging. Excitation pulse 80 includes a number of RF sub-elements 82. As shown, these elements 82 represent periodic sinc functions of gradually increasing, then decreasing amplitudes. However, it is recognized that RF sub-elements 82 may take many forms other than merely sinc functions, such as Gaussian waveforms. The frequency of the RF elements 82 may be selected to correspond to the resonant frequency of a particular substance of interest, for spectral encoding. For example, the resonant frequency of nuclei of a hyperpolarized substance may be targeted by pulse 80.

Along with the RF pulses 82, a slice encoding gradient 84 is applied. Slice encoding gradient 84 is a periodic gradient of alternating sign. In combination, RF elements 82 and gradient 84 allow for slice-selective excitation within a specific frequency range. The spectral excitation profile of the pulse (to be described below) is periodic with a periodicity of $1/\Delta$ Hz, where $\Delta$ represents the time distance between the sub-elements of the RF waveform 80. In a preferred embodiment, excitation pulse 80 is applied to effect approximately a 90 degree total flip angle, though it is contemplated that other flip angles are also suitable. For example, the polarization and sensitivity to RF magnetization destruction of a contrast agent, the number of excitations desired, or the desired image resolution may affect the strength of the pulse to be applied.

Figure 3:
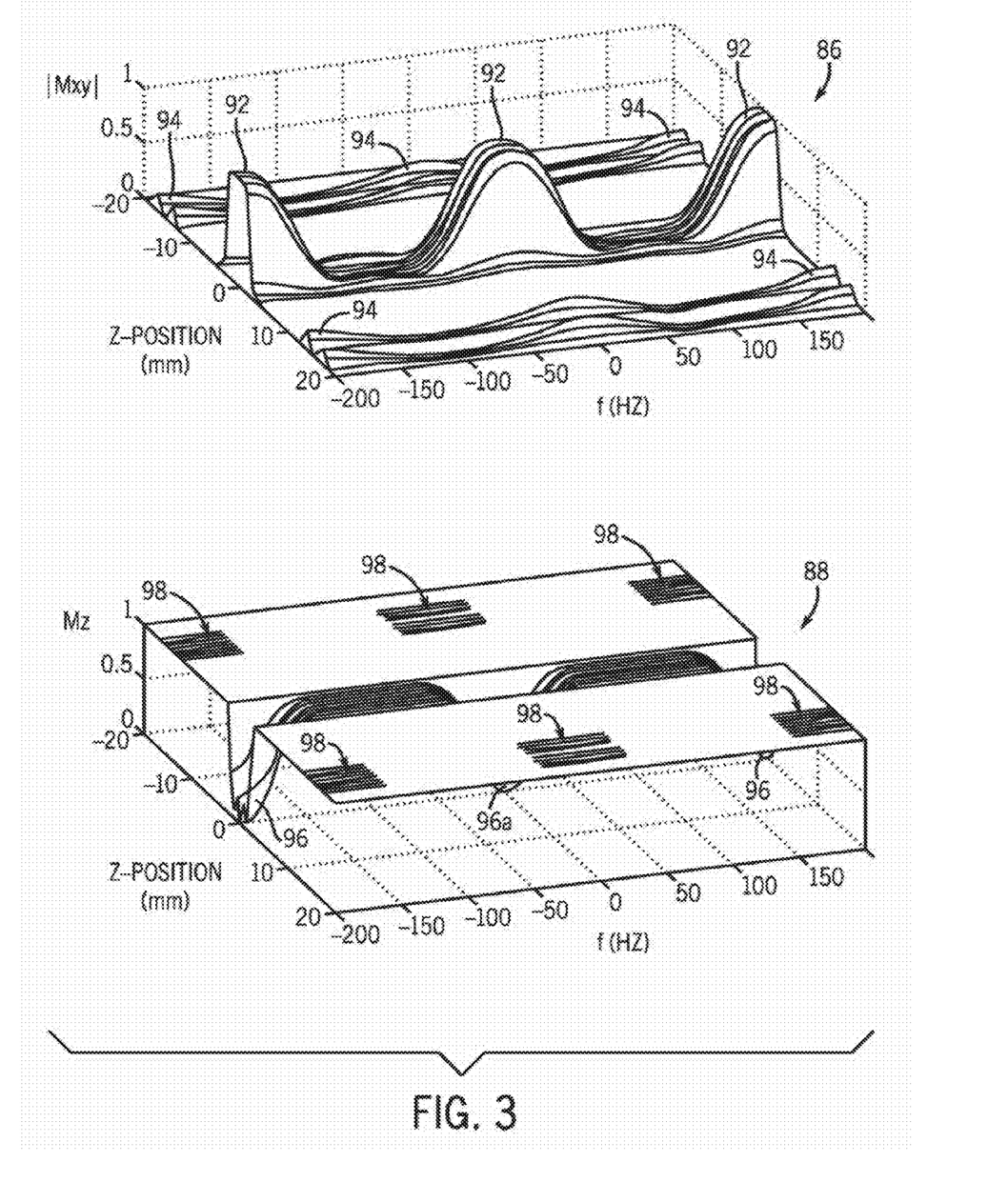
FIG. 3 is a 3-D graph of an excitation profile for a spectral-spatial pulse in accordance with an embodiment of the present invention.

Referring now to FIG. 3, the effects upon magnetization of an arbitrary spectral-spatial pulse (such as described with reference to FIG. 2) are shown. The upper plot 86 shows transverse magnetization Mxy and the lower plot 88 shows longitudinal magnetization Mz. The horizontal axes of the plots 86, 88 represent spectral frequency, the front-to-back axes represent geometric position along the z axis, and the vertical axes show magnetization. As shown, the primary transverse magnetization 92 is centered along the position marked as 0 mm along the z-position axis. Along the spectral axis, the magnetization 92 is periodic, centered at 0 Hz. As discussed above, the periodicity of magnetization 92 is dependant upon the Δ component of the spectral-spatial pulse applied. Thus, a desired period 1/Δ Hz may be attained by altering this characteristic of the spectral-spatial pulse. Magnetization 94 outside the primary slice is relatively weak in comparison. Likewise, magnetization at spectral positions 100 Hz on either side of primary magnetization 92 is nearly non-existent.

Lower plot 88 of FIG. 3 shows converse effects upon longitudinal magnetization. A corresponding primary decrease in longitudinal magnetization 96 is centered at the position marked as 0 mm along the z-position (front-to-back) axis. The primary reduction in magnetization 96 is periodic, centered at 0 Hz, as is the case with transverse magnetization. The period of the primary longitudinal magnetization reduction 96 is also 1/Δ Hz, dependant upon the spectral-spatial pulse applied. Magnetization at approximately 100 Hz on either side of primary magnetization reduction 96 remains at the initial strength (i.e. essentially unchanged by application of the spectral-spatial pulse). Likewise, magnetization 98 outside the primary slice along the z-position axis remains relatively unchanged.

Figure 4:
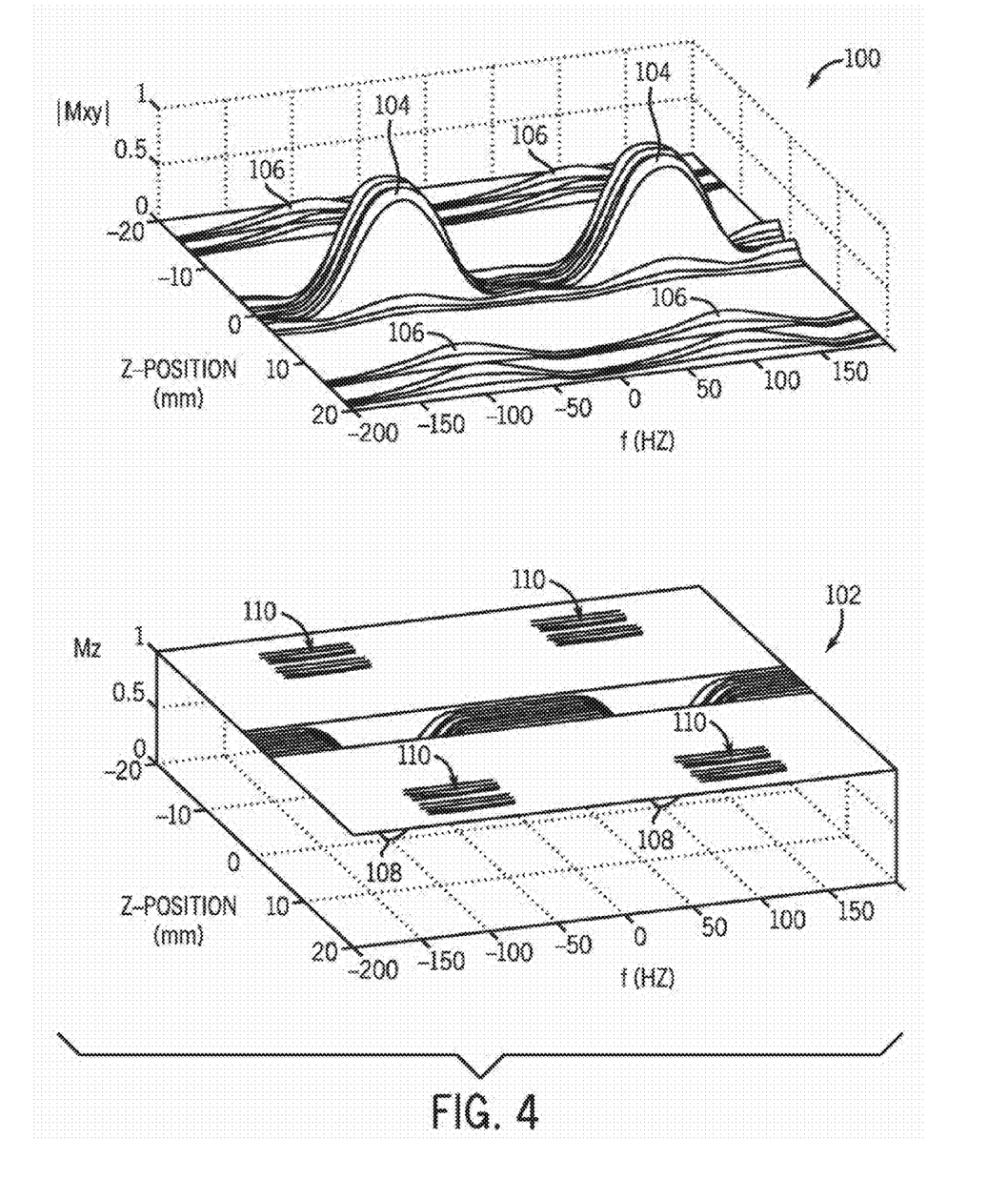
FIG. 4 is a 3-D graph of an excitation profile for a spectral-spatial pulse exciting a different frequency band than that of FIG. 3, in accordance with an embodiment of the present invention.

FIG. 4 depicts the effects upon transverse 100 and longitudinal 102 magnetization from a spectral-spatial pulse having an excitation frequency shifted 100 Hz apart from that of FIG. 3. Again, primary transverse magnetization 104 is centered along a slice at 0 mm on the z-position axis. In the spectral frequency axis, transverse magnetization 104 is periodic by 1/Δ Hz. Transverse magnetization at 0 Hz, −200 Hz, and 200 Hz is nearly unaffected and magnetization 106 outside the primary slice is relatively small. Primary longitudinal magnetization reduction 108 is also centered at 0 mm on the z-position axis, and is periodic by 1/Δ Hz. Longitudinal magnetization 110 outside the slice and between the peaks of primary magnetization 108 is nearly unaffected in comparison to primary longitudinal magnetization reduction 108. In other words, the frequency profile of the spectral-spatial pulse creating transverse magnetization 100 and longitudinal magnetization 102 was designed to complement the frequency profile of the pulse of FIG. 3.

Figure 5:
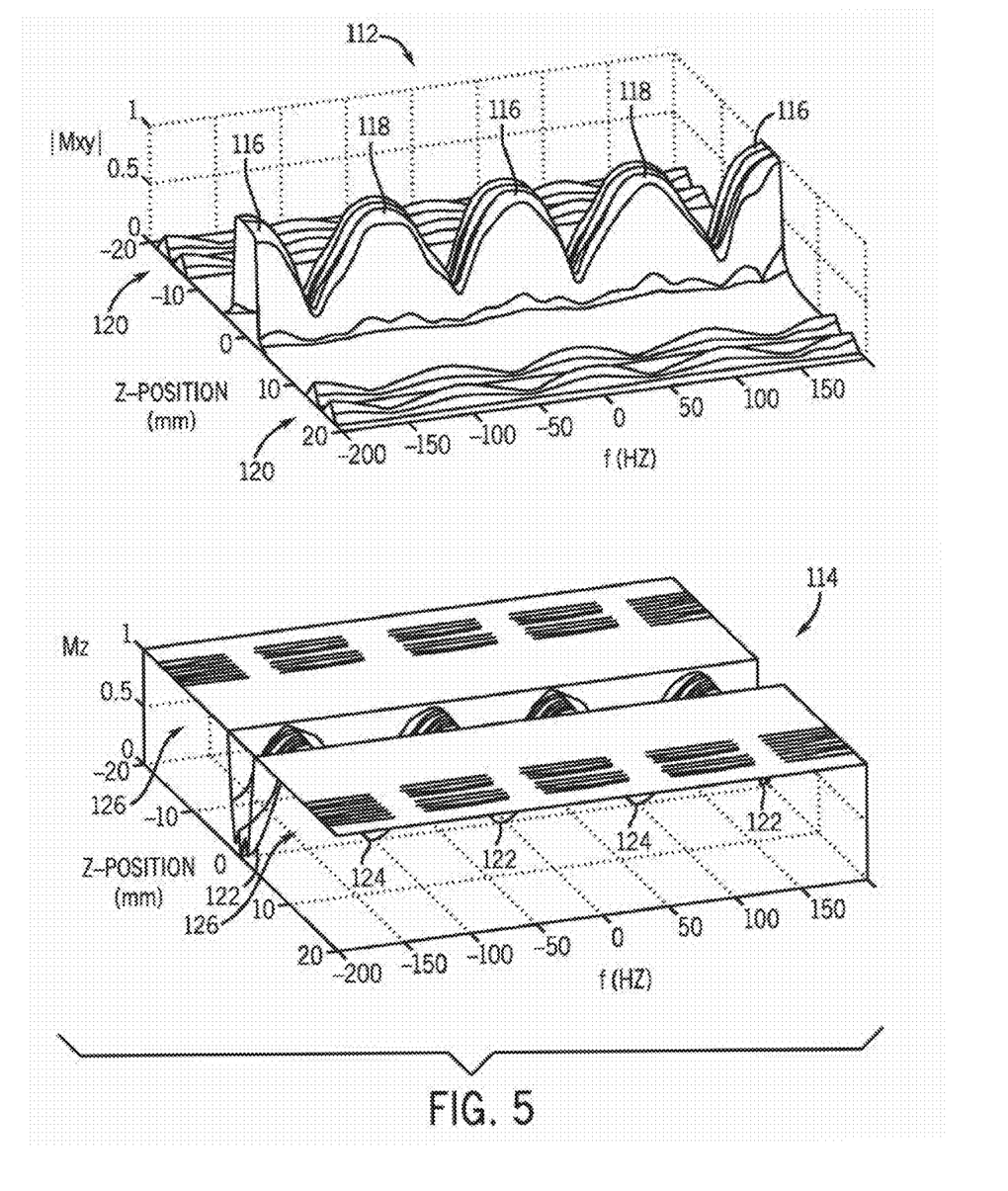
FIG. 5 is a 3-D graph of an excitation profile for the spectral-spatial pulses of FIG. 3 and FIG. 4 combined, in accordance with an embodiment of the present invention.

In this regard, FIG. 5 shows the effects upon transverse 112 and longitudinal 114 magnetization of sequentially applying the spectral-spatial pulses of FIGS. 3 and 4. That is, transverse magnetization 116 is created by a spectral-spatial pulse of a first excitation frequency (such as that of FIG. 3) and transverse magnetization 118 is created by a second spectral-spatial pulse of a second excitation frequency (such as that of FIG. 4). Transverse magnetization 120 outside the primary slice and at frequencies falling outside the period of magnetization 116, 118 (such as at −150 Hz, −50 Hz, 50 Hz, 150 Hz) is relatively small in comparison. Similarly, longitudinal magnetization is decreased 122 by the same spectral-spatial pulse of the first frequency and is decreased 124 by the spectral-spatial pulse of the second frequency. Longitudinal magnetization 122 outside the primary slice, and at frequencies falling outside the periods of magnetization reductions 122, 124 (such as at −150 Hz, −50 Hz, 50 Hz, 150 Hz) is nearly unaffected.

Figure 6:
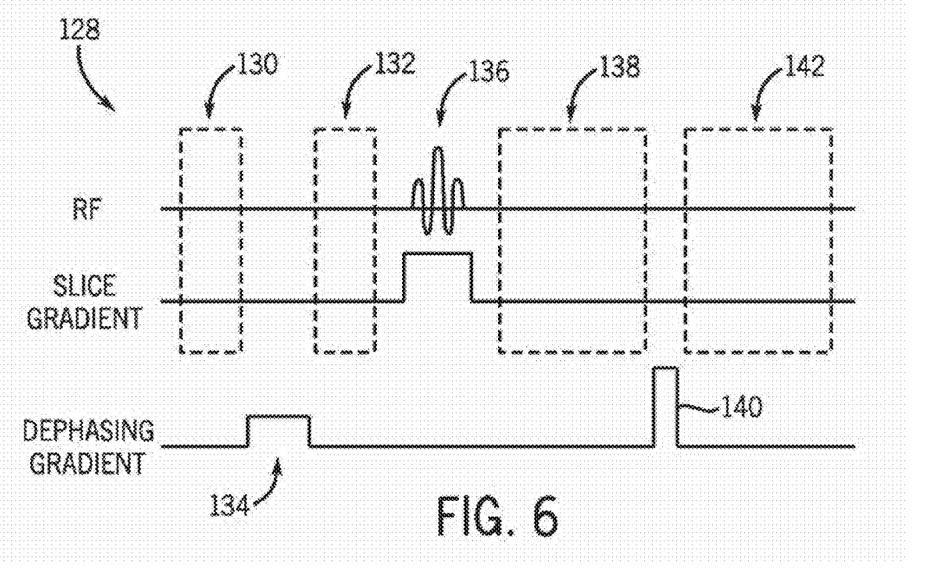
FIG. 6 is a graph of an imaging sequence in accordance with an embodiment of the present invention.

Referring now to FIG. 6, a data acquisition sequence 128 incorporating two spectral-spatial pulses 130, 132 is shown. From beginning to end, sequence 128 may be designed to take less than one second to acquire data. In a preferred embodiment, sequence 128 is adapted for imaging a metabolic process. In this regard, the excitation frequencies of the spectral spatial pulses 130, 132 may be keyed to the resonant frequencies of a hyperpolarized contrast agent and a metabolite, two contrast agents, two metabolites, and/or combinations thereof. For example, the excitation frequency of spectral spatial pulse 130 may be designed to excite the nuclei of hyperpolarized 13-C labeled pyruvate and the spectral spatial pulse 132 may be designed to excite the nuclei of 13-C alanine, bicarbonate, or lactate (metabolites of 13-C pyruvate). However, it is recognized that other substances with other excitable nuclei are equally applicable (such as 13-C urea or substances having 14-N, 31-P, 19-F, and 23-Na nuclei, other NMR relevant nuclei, and metabolites thereof).

Acquisition sequence 128 begins with emission of a first spectral-spatial pulse 130, which causes excitation of a substance of corresponding resonant frequency. A dephasing gradient pulse 134 is then applied to dephase the signals/excitations resulting from the first spectral-spatial pulse. A second spectral-spatial pulse 132 is then transmitted, to excite a second substance having a resonant frequency corresponding thereto. Preferably, spectral-spatial pulses 130, 132 have flip angles of approximately 90 degrees. At this point, longitudinal magnetization and transverse magnetization will appear somewhat like that shown in FIG. 5. Sequence 128 next includes an RF pulse 136 (which may be slice selective or non-selective) at a frequency range covering the excitation frequencies of both the first 130 and second 132 spectral-spatial pulses. RF pulse 136 preferably has a flip angle of 180 degrees. The read-out or data sampling/acquisition stage begins thereafter, in a reverse order. That is, the signals resulting from the second spectral-spatial pulse 132 are sampled or otherwise acquired first 138. Read-out may take the form of several well-known acquisition sequences, such as an echo planar imaging (EPI) readout (for example, spin echo EPI), a rapid acquisition with relaxation enhancement (RARE) read-out, a true fast imaging with steady precession (trueFISP) readout, or variations thereof. After the readout 138 of spectral-spatial pulse 132, a rephasing gradient 140 is applied to counteract the effect of the dephasing gradient 134. Data acquisition then takes place 142 for the signals resulting from spectral-spatial pulse 130 in a well-known manner. Additionally, each readout 138, 142 may have a timing different from the spectral-spatial pulses or from other read-outs. It is recognized that sequence 128 may be extended to image more than two substances, agents, and/or metabolites. In such embodiments, a dephasing gradient is applied between each spectral-spatial pulse and read-out takes place in an order reversed from the order in which the spectral-spatial pulses were applied, and a rephasing gradient is applied between read-outs.

Figure 7:
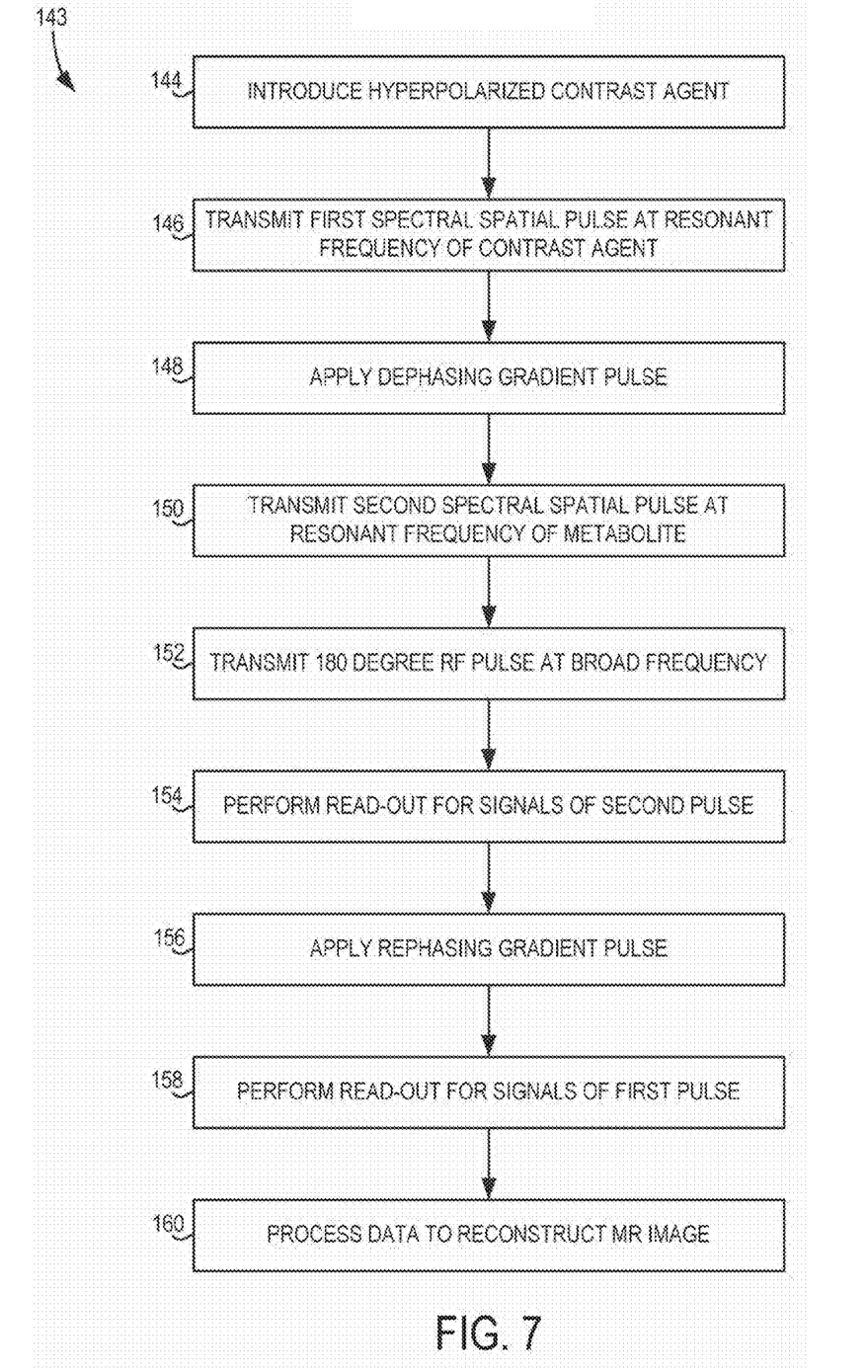
FIG. 7 is a flowchart illustrating a technique for MR imaging of metabolites at selective excitation frequencies in accordance with an embodiment of the present invention.

FIG. 7 is a flowchart illustrating a technique 143 for selective imaging of metabolites in accordance with an embodiment of the present invention. A hyperpolarized contrast agent is introduced into an imaging subject at block 144. Next, a first spectral-spatial pulse is transmitted at the resonant frequency of the contrast agent at block 146. This pulse may be delayed a specific time period after introduction of the agent to allow for perfusion into tissues, or for the agent to reach an organ of diagnostic interest. Alternatively, a period of delay may correspond to an amount of time for the contrast agent to be metabolized, in which case the first spectral-spatial pulse may be keyed to the resonance of the metabolite. After the first spectral-spatial pulse has been transmitted by the RF coil assembly, a dephasing gradient pulse is applied at block 148 to dephase the signals/magnetization produced by the spectral-spatial pulse. A second spectral spatial pulse is then transmitted to excite the resonant frequency of a metabolite at block 150. This may be the first metabolite of a contrast agent to be excited, or may be in addition to another metabolite already excited by the first spectral-spatial pulse. As mentioned above, a number of subsequent dephasing gradient pulses and spectral spatial pulses may be transmitted and applied to excite additional metabolites or other substances of interest. Once excitations are complete, at block 152 a 180 degree RF pulse is transmitted at a frequency range of sufficient breadth to encompass the resonant frequencies of all the transmitted spectral-spatial pulses.

Signal read-out then begins in a reverse order at block 154. As shown, the first set of MR signals to be acquired are those produced by the second spectral-spatial pulse 154. If more than two spectral-spatial pulses were transmitted, the signals of the last spectral-spatial pulse transmitted will be read first. A rephasing gradient pulse is applied at block 156 before the next read-out, to counteract the effects of dephasing gradient pulse applied at block 148. The read-out for the MR signals produced by the first spectral-spatial pulse is then commenced at block 158. Once all MR data has been acquired, the data is processed to reconstruct an image, according to any of the known reconstruction techniques at block 160.

Since data acquisition of technique 143 may take place with just one RF pulse per resonant frequency, and since each spectral-spatial RF pulse is precise enough not to affect nearby resonant frequencies, the full magnetization of hyperpolarized agents may efficiently be utilized. In other words, magnetization created by one spectral-spatial pulse is not destroyed by a subsequent pulse, nor is hyperpolarization used up. In addition, since acquisition sequences of the present invention may be designed to take place in relatively short amounts of time (such as under 1 second), the hyperpolarization of contrast agents and metabolites will typically not decay to a significant degree.

Accordingly, an embodiment of the present invention includes an MR system having a plurality of gradient coils, an RF coil assembly, and a system control. The system control is programmed to cause the RF coil assembly to emit two spectral-spatial RF pulses, then to detect the resulting MR signals from the second pulse before detecting the MR signals from the first pulse.

Another embodiment of present invention includes a method for MR imaging. The method includes individually exiting the resonant frequencies of two or more metabolites at one flip angle, then simultaneously exciting the resonant frequencies of the metabolites at a second flip angle. After excitation, the resulting MR signals of the metabolites are detected.

In another embodiment of the present invention, a sequence of instructions is stored on a computer readable storage medium. When the instructions are executed by a computer, the computer is caused to request a spectral-spatial pulse at one frequency, a dephasing gradient pulse for that frequency, another spectral-spatial pulse at another frequency, and then an RF pulse over a frequency range including both frequencies The present invention has been described in terms of the preferred embodiment, and it is recognized that equivalents, alternatives, and modifications, aside from those expressly stated, are possible and within the scope of the appending claims. The order and sequence of process or method steps may be varied or re-sequenced according to alternative embodiments.

What is claimed is:

1. A method of MR imaging comprising:
   individually exciting resonant frequencies of at least two metabolites at a first flip angle;
   simultaneously exciting the resonant frequencies of the at least two metabolites at a second flip angle; and then detecting MR signals resulting from the excitations.

2. The method of claim 1 wherein individually exciting resonant frequencies of the at least two metabolites includes transmitting a first spectral-spatial RF pulse and a second spectral-spatial RF pulse.

3. The method of claim 2 further comprising applying a rephasing gradient between detection of MR signals resulting from individually exciting a resonant frequency of a second of the at least two metabolites and detection of MR signals resulting from individually exciting a resonant frequency of a first of the at least two metabolites.

4. The method of claim 2 further comprising calibrating the individual resonant frequency excitations, the simultaneous resonant frequency excitation, and the MR signal detection to utilize a full magnetization of a hyperpolarized contrast agent.

5. The method of claim 1 further comprising applying a dephasing gradient pulse between individually exciting a resonant frequency of a first of the at least two metabolites and individually exciting a resonant frequency of a second of the at least two metabolites.

6. The method of claim 1 wherein simultaneously exciting the resonant frequencies of the at least two metabolites at the second flip angle includes applying a 180 degree excitation pulse having a frequency range encompassing the resonant frequencies of the at least two metabolites.

7. The method of claim 1 wherein the first flip angle is 90 degrees.

8. The method of claim 1 wherein detecting the MR signals resulting from the excitations includes detecting the MR signals resulting from the excitations in a reverse order.

9. The method of claim 1 wherein the at least two metabolites include a hyperpolarized contrast agent and at least one metabolite of the hyperpolarized contrast agent.

10. A non-transitory computer readable storage medium having a sequence of instructions stored thereon which, when executed by a computer, causes the computer to request:
    transmission of a first spectral-spatial pulse at a first frequency;
    transmission of a dephasing gradient pulse for the first frequency;
    transmission of a second spectral-spatial pulse at a second frequency; and
    transmission of an RF pulse having a frequency range encompassing the first frequency and the second frequency.

11. The non-transitory computer readable storage medium of claim 10 wherein the sequence of instructions further causes the computer to request readouts of MR signals corresponding to the first and second spectral-spatial pulses.

12. The non-transitory computer readable storage medium of claim 11 wherein the sequence of instructions causes the computer to request transmission of a dephasing gradient pulse between readouts of the MR signals corresponding to the first and second spectral-spatial pulses.

13. The non-transitory computer readable storage medium of claim 11 wherein the sequence of instructions further causes the computer to request the readouts of the MR signals corresponding to the first and second spectral-spatial pulses in an order reversed from an order in which the first and second spectral-spatial pulses were requested.

14. The non-transitory computer readable storage medium of claim 10 wherein the first and second spectral-spatial pulses each include multiple RF pulse elements and an alternating slice gradient.

15. The non-transitory computer readable storage medium of claim 10 wherein the first frequency and the second frequency are approximately 100 Hz apart.

16. The non-transitory computer readable storage medium of claim 10 wherein the first frequency and the second frequency correspond to resonant frequencies of hyperpolarized metabolites.

17. The non-transitory computer readable storage medium of claim 16 wherein the sequence of instructions causes the computer to request transmission of RF pulses which utilize substantially all magnetization of the hyperpolarized metabolites.

* * * * *